United States Patent [19]

Wuensch et al.

[11] Patent Number: 5,415,977
[45] Date of Patent: May 16, 1995

[54] PRODUCTION OF MICROMOLDINGS HAVING A HIGH ASPECT RATIO

[75] Inventors: Thomas Wuensch, Bad Durkheim; Peter Hoessel, Schifferstadt; Gerhard Hoffmann, Otterstadt; Juergen Langen, Bonn, all of Germany

[73] Assignee: BASF Aktiengesellschaft, Ludwigshafen, Germany

[21] Appl. No.: 102,519

[22] Filed: Aug. 5, 1993

Related U.S. Application Data

[63] Continuation of Ser. No. 847,400, Mar. 6, 1992, abandoned.

[30] Foreign Application Priority Data

Mar. 12, 1991 [DE] Germany .................. 41 07 851.9

[51] Int. Cl.⁶ .................................................. G03F 7/30
[52] U.S. Cl. .................................. 430/326; 430/324; 430/967; 264/25
[58] Field of Search .................. 430/326, 967, 324, 8; 264/25

[56] References Cited

U.S. PATENT DOCUMENTS

| | | | |
|---|---|---|---|
| 2,892,712 | 6/1959 | Plambeck | 430/270 |
| 3,549,733 | 3/1974 | Caddell | |
| 3,991,033 | 11/1976 | Sam | 430/230 |
| 4,150,989 | 4/1979 | Chambers et al. | 430/322 |
| 4,393,129 | 7/1983 | Glashauser et al. | |
| 5,112,707 | 5/1992 | Kato et al. | 430/967 |

FOREIGN PATENT DOCUMENTS 2027575  10/1971  France .

OTHER PUBLICATIONS

E. W. Becker et al., 8226 Nucriekectribuc Engineering 4 (1986), No. 1, Amersterdam, The Netherlands.
Hatada et al., 2445 Polymer Bulletin, vol. 8 (1982) Nov. 9/10 Heidelberg, Deutschland, p. 469.
Methoden der organischen Chemie (Houben-Weyl), Georg Thieme Verlag, Stuttgart (1963), vol. XIV/2, pp. 404 to 410, and vol. 20 (1987), pp. 1390 to 1398 no translation.
The Radiation Chemistry of Macro-molecules, edited by Dole, Dept of Chemistry Baylor University, vol. II, Academic Press, New York, London, 1973, p. 187 ff.

Primary Examiner—Christopher D. Rodee
Attorney, Agent, or Firm—Keil & Weinkauf

[57] ABSTRACT

A process for the production of micromoldings having a high aspect ratio by imagewise irradiation of a polymer with high-energy, parallel radiation from an X-ray source employs, as the polymer, a homo- or copolyoxymethylene.

5 Claims, No Drawings

PRODUCTION OF MICROMOLDINGS HAVING A HIGH ASPECT RATIO

This application is a continuation of U.S. application Ser. No. 07/847,400, filed on Mar. 6, 1992, now abandoned.

The invention relates to a process for the production of micromoldings having a high aspect ratio, i.e. having extremely large structure heights with lateral dimensions in the micron range, by irradiating polymers or polymer mixtures followed by development with suitable developer media.

The development of microelectronics has shown that the consequent miniaturization and integration has resulted in a confusing variety of new products with corresponding technologies. In a few years, microelectronics has achieved a considerable lead in miniaturization over other branches of industry. In the meantime, it is emerging that other microtechnologies will in the future also achieve considerable importance; mention should be made, in particular, of micromechanics and integrated optics. In combination with microelectronics, technologies of this type open up an unimaginable number of new electronic, optical, biological and mechanical function elements.

In mass production of nonelectronic assemblies, system components and subsystems of microtechnology, the extremely high-performance production methods of semi-conductor technology are naturally utilized to a very considerable extent. At the same time, it must be attempted to update classical methods of precision engineering for micromechanics and to fuse them with appropriately modified semiconductor production methods in order to be able to leave the narrow confinements of silicon planar technology and to develop new design possibilities based on a wide range of shapes and materials. This requirement is satisfied, for example, to a considerable extent by the LIGA process, which is based on the production steps
- lithography,
- electroforming and
- casting and was developed at the Kernforschungszentrum Karlsruhe (KfK). It enables the production of microstructure elements having a high aspect ratio, i.e. having lateral dimensions in the micron range and structure heights of several hundred microns, from plastics, metals and ceramics.

The LIGA process is based on the concept of producing precise primary structures with a great structure height by a lithography process with a high depth sharpness and replicating these structures a number of times by one or more casting processes. This production concept is flexible and can be matched to the boundary conditions which are determined by the particular microstructure product and relate, inter alia, to the geometry, the materials used or to the number of pieces and determine the type and sequence of the individual production steps.

A typical production sequence for the mass production of microstructure elements of metal by the LIGA process contains a plurality of process steps.

In a first step, a polymer layer up to several hundred microns thick on an electroconductive substrate is irradiated through an X-ray mask with high intensity, parallel X-ray radiation generated as so-called synchrotron radiation in an electron synchrotron or an electron storage ring.

The irradiation increases the solubility of the polymer or polymer mixture in selected developer media to such an extent that the irradiated material areas can be removed, giving a relief-like polymer structure on the electroconductive substrate.

In the next production step, metal is electro-deposited on the substrate between the polymer structures, giving a metal structure which is complementary to the polymer relief. If the metal deposition is continued until the polymer structures are overgrown with a thick metal layer, a stable, coherent microstructure element comprising uniform material is obtained which can be used in the next process step as a mold insert for a casting process using plastic. Mass production of microstructure elements from plastic is thus possible.

The plastic structure produced may be the end product; alternatively, a template for a further electro-forming step can be produced using a metallic feed plate. Templates of this type can again be produced in large numbers.

The production sequence described can be adapted to the requirements of specific microstructures, so that a wide variety of different microstructures can be produced. Interesting microstructure products are sensors for measuring acceleration, flow rate, ultrasound, humidity and the like, micromotors, micropneumatic components, microconnectors for microelectronics, microoptical components, fiber optics, microelectrodes, spinnerets, microfilters, sliding bearings, membranes and many others.

The essential production step of the LIGA process is the structure-accurate irradiation of the polymer employed. The feasibility of the LIGA process has been demonstrated by means of simple microstructures using a specially prepared polymethyl methacrylate (referred to as PMMA below).

In the conversion of complex three-dimensional structures, it has become apparent that PMMA requires a high radiation output.

It has furthermore been shown that, in the development of the irradiated polymer areas using a suitable developer medium, the nonirradiated areas swell, possibly destroying fine microstructures. On the other hand, swollen polymer areas may result in stress cracking on drying, which leads to unusable microstructure elements during electroforming. The cause of these problems is the high solvent sensitivity of PMMA.

The mechanical stability of the polymer should also be improved for the LIGA process. During electroforming of the microstructure element, elevated temperatures are achieved, in some cases resulting in warping of particularly critical structures having a high aspect ratio. Structure elements of this type cannot be employed for casting.

It is an object of the present invention to find a suitable polymer which does not have the abovementioned disadvantages. A polymer which is suitable for this object should have high X-ray sensitivity, should depolymerize on exposure to X-ray light, and should be selectively removable using specific developers; the polymer should furthermore facilitate simple sample production, for example by injection molding, pressing, extrusion or casting, and should not exhibit any swelling, stress cracking or defects.

We have found that, surprisingly, this object is achieved by homo- and copolyoxymethylenes.

The suitability of polyoxymethylenes for the production of micromoldings in which a high aspect ratio is important, as is necessary for the LIGA process, and the advantages arising were surprising and were not obvious from the publications published hitherto.

The present invention accordingly provides a process for the production of micromoldings having a high aspect ratio by imagewise irradiation of a polymer with high-energy, parallel radiation from an X-ray source, wherein the polymer employed is a homo- or copolyoxymethylene.

For the purposes of the present invention, micromoldings having a high aspect ratio are microstructure elements with structure depths of from several $\mu$m up to the mm range.

The high-energy, parallel radiation employed is preferably synchrotron radiation.

To this end, the homo- or copolyoxymethylene can be applied to a base in a layer thickness of up to 2000 $\mu$m by injection molding, extrusion and/or pressing, preferably.

The present invention also provides a process for the production of microstructures, which comprises irradiating the homo- or copolyoxymethylene imagewise using synchrotron radiation, treating the irradiated polymer with a selective developer, preferably, for example, phenol or aqueous mineral acid, then structuring the polymer to a depth of from 50 $\mu$m to 2000 $\mu$m with lateral dimensions of less than 10 $\mu$m.

For the purposes of the present invention, the aspect ratio is the ratio between the height and the lateral dimension of the molding structures or of the relief or the ratio between the maximum structure height and the minimum lateral dimension. In the process according to the invention, the aspect ratio can be varied within broad limits, for example from 10:1 to 1000:1, preferably from 50:1 to 100:1.

In the process according to the invention, the irradiation is carried out using high-energy, parallel radiation from an X-ray source. The wavelength of this irradiation is in the range from 0.1 to 10 nm, preferably from 0.1 to 1 nm.

Irradiation of this type can be produced, for example, on a synchrotron using special preabsorbers, for example comprising beryllium and/or polyimide film (for example Kapton® from Du Pont de Nemours) at an irradiation output of 200 to 2000 mA.min.

The irradiation output depends on the electron energy in the electron storage ring which branches off from the synchrotron. In general, the electron energy is from 1.6 to 2.3 GeV.

The imagewise irradiation is usually carried out using special X-ray masks, for example a titanium base foil with gold absorber structures.

The polymer employed according to the invention is a homo- or copolyoxymethylene.

Polyoxymethylenes and their preparation are known and described, for example in Methoden der organischen Chemie (Houben-Weyl), Georg Thieme Verlag, Stuttgart (1963), Volume XIV/2, pages 404 to 410, and Volume E20 (1987), pages 1390 to 1398). Their photosensitivity and their reaction products obtained by photochemical processes on exposure to $\gamma$-rays have also been investigated and are described in The Radiation Chemistry of Macro-molecules, edited by Malcolm Dole, Dept. of Chemistry, Baylor University, Waco, Texas, Vol. II, Academic Press, New York, London, 1973, pages 187 ff.

Polyoxymethylenes which are suitable for the process according to the invention are homopolymers of formaldehyde or copolymers of formaldehyde and of tri-oxane with cyclic and/or linear formals, such as butanediol formal, or epoxides, such as ethylene oxide or propylene oxide. The homopolymers generally carry thermally stable end groups, such as ester or ether groups. The copolymers of formaldehyde or of trioxane preferably contain more than 50%, in particular more than 75%, of oxymethylene groups. Particularly successful copolymers are those which contain at least 0.1% of groups of a comonomer which has at least two adjacent carbon atoms in the chain, e.g. butanediol formal or ethylene oxide. Of particular industrial importance are polyoxymethylenes which contain from 1 to 10% by weight of comonomers. Such copolymers are obtainable in a conventional manner by cationic copolymerization of trioxane with suitable comonomers, such as cyclic ethers or acetals, e.g. ethylene oxide, 1,3-dioxolane, 1,3-dioxane or 1,3-dioxacycloheptane, or with linear oligo- or polyformals, such as polydioxolane or poly-butanediol formal. In general, the poloxymethylenes used have a molecular weight (number average) $\overline{M}_n$ of from 2,000 to 100,000, preferably of from 10,000 to 100,000, and an MFI at 190° C., 21.17 N in accordance with DIN 53 735 of from 0.5 to 200, preferably from 1 to 100. Particularly important polymers are those built up from trioxane and from 1 to 10 mol-% of ethylene oxide, 1,3-dioxolane or butanediol formal.

Although polyoxymethylenes are generally known to be acid-sensitive, it was possible to selectively remove the irradiated areas using acids without attack on non-irradiated areas taking place. The microstructures obtained in this way have considerably greater structure depths under the same irradiation conditions compared with the GG developer as described in DE-C 30 39 100 for PMMA. Development using bases also resulted in selective removal of the irradiated areas, but the structure depths achieved were less than those obtainable on development using acids. A considerable improvement was achieved by using the developer in combination with ultrasound or megasound. Under these conditions, considerably greater structure depths were achieved in many cases than on development without ultrasound or megasound under otherwise identical conditions.

Another suitable developer is phenol, using which the irradiated areas can be removed selectively. Here too, the structure depths are considerably greater than for PMMA at the same irradiation output.

The polyoxymethylenes employed were investigated both before and after irradiation/development for stability under the electroplating conditions used in the LIGA process. There were no adverse changes in the samples employed, which was demonstrated by means of mechanical tests in comparison with nonirradiated samples. It was thus possible to produce structures having lateral dimensions of less than 10 $\mu$m with a maximum structure depth of several hundred microns and no defects.

The polymers can also be administered with stabilizers against thermooxidative degradation, nucleating agents and costabilizers, in each case in amounts of <2%.

In order to produce moldings, as stated above, the homo- or copolyoxymethylene, as granules or in powder form, can be applied to and fixed on an electroconductive metal substrate, for example nickel, copper or steel, to which a 0.1 to 50 $\mu$m layer of a further metal or metal oxide, e.g. titanium, may have been applied, by conventional processes, for example by pressing, injection molding and/or extrusion, at from 20° to 240° C., if necessary with the additional use of special adhesive coatings or adhesion promoters. The thickness of the homo- or copolymer layer on the metal substrate is generally from 20 to 2000 μm, preferably from 50 to 800 μm, in particular from 100 to 500 μm. The surface of the homo- or copolymer layers should expediently be very smooth.

After imagewise irradiation, development is carried out using suitable developer media, i.e. suitable organic solvents, such as phenol, or aqueous mineral acid, e.g. dilute approx. 10% hydrochloric acid or nitric acid, at from 50° to 150° C.

Development depths of up to 600 μm are achieved in this way. The resultant microstructures have sharp, steep edges and smooth walls and are resistant to the electroplating baths, e.g. acidic copper or nickel baths. The microstructures remain unchanged after 24 hours in an electroplating bath at from 20° to 60° C.

In the Examples, parts and percentages are by weight, unless stated otherwise.

EXAMPLE 1

A copolymer comprising trioxane and butanediol formal (e.g. Ultraform ® N 2320, a commercial product from BASF Aktiengesellschaft) was irradiated imagewise as a test specimen (dimensions 30×10×2 mm) on a synchrotron at an irradiation output of 1600 mA min under a copper wire mask. The material removal took place during subsequent development using phenol at 90° C. for 10 minutes. The structure depth was 480 μm.

COMPARATIVE EXAMPLE 1

A test specimen made from PMMA was treated correspondingly at an irradiation output of 1600 mA·min. The structure depth was only 50 μm (development using GG developer).

EXAMPLE 2

A homopolyoxymethylene containing acetyl end groups (e.g. Delrin ® 500 NC, a commercial product from Du Pont de Nemours) was irradiated in the form of a test specimen (dimensions 30×10×2 mm) on a synchrotron at an irradiation output of 1600 mA min. The material removal took place during subsequent development using aqueous HCl (10% strength) at 80° C. for 10 minutes. The structure depth was 440 μm.

COMPARATIVE EXAMPLE 2

A test specimen made from PE was treated in the same way as in Example 2 at an irradiation output of 1600 mA·min. The structure depth was only 50 μm.

EXAMPLE 3

A copolymer comprising trioxane and ethylene oxide (e.g. Hostaform ® C 9021, a commercial product from Hoechst AG) was irradiated imagewise as a test specimen (dimensions 30×10×2 mm) on a synchrotron at an irradiation output of 1600 mA·min using a copper wire mask. The material removal took place during subsequent development using phenol at 90° C. for 10 minutes. The structure depth was 660 μm.

COMPARATIVE EXAMPLE 3

A test specimen made from PMMA was treated in the same manner as in Example 3 at an irradiation output of 1600 mA·min. The structure depth was only 50 μm.

We claim:

1. A process for the production of micromoldings having a high aspect ratio which comprises imagewise irradiation of a polymer with high-energy, parallel radiation from an X-ray source at an irradiation output of 200 to 2000 mA·min, treating the irradiated polymer with a selective developer, and structuring the polymer to a depth of form 50 μm to 2000 μm with lateral dimensions of less than 10 μm, said structuring being the result of the irradiation and development, wherein the polymer employed is a homopolymer of formaldehyde, a copolymer of formaldehyde or trioxane with cyclic or linear formals, a copolymer of formaldehyde with epoxides or a copolymer of trioxane with epoxides, which homopolymers carry thermally stable end groups.

2. A process as claimed in claim 1, wherein the high-energy, parallel radiation employed is synchrotron radiation.

3. A process for the production of microstructures, which comprises irradiating homo- or copolyoxymethylene imagewise using X-ray synchrotron radiation, treating the irradiated polymer with a selective developer, thereby structuring the polymer to a depth of from 50 μm to 2000 μm with lateral dimensions of less than 10 μm.

4. A process as claimed in claim 3, wherein the homo- or copolyoxymethylene is applied to a base in a layer thickness of up to 2000 μm by injection molding, extrusion and/or pressing.

5. A process as claimed in claim 3, wherein the selective developer employed is phenol or aqueous mineral acid.

* * * * *